United States Patent
Wang et al.

(10) Patent No.: US 7,945,833 B1
(45) Date of Patent: *May 17, 2011

(54) METHOD AND APPARATUS FOR PIPELINED SCAN COMPRESSION

(75) Inventors: Laung-Terng (L.-T.) Wang, Sunnyvale, CA (US); Nur A. Touba, Austin, TX (US); Boryau (Jack) Sheu, San Jose, CA (US); Shianling Wu, Princeton Junction, NJ (US); Zhigang Jiang, San Jose, CA (US)

(73) Assignee: Syntest Technologies, Inc., Sunnyvale, CA (US)

( * ) Notice: Subject to any disclaimer, the term of this patent is extended or adjusted under 35 U.S.C. 154(b) by 618 days.

This patent is subject to a terminal disclaimer.

(21) Appl. No.: 11/889,710

(22) Filed: Aug. 15, 2007

Related U.S. Application Data

(63) Continuation-in-part of application No. 11/122,244, filed on May 5, 2005, now Pat. No. 7,590,905.

(60) Provisional application No. 60/573,341, filed on May 24, 2004.

(51) Int. Cl.
*G01R 31/3177* (2006.01)
*G01R 31/40* (2006.01)

(52) U.S. Cl. ........................................ 714/729; 714/733

(58) Field of Classification Search .................. None
See application file for complete search history.

(56) References Cited

U.S. PATENT DOCUMENTS

| | | | |
|---|---|---|---|
| 6,327,687 B1 | 12/2001 | Rajski et al. | |
| 6,553,530 B1 * | 4/2003 | Kim | 714/738 |
| 6,611,933 B1 | 8/2003 | Koenemann et al. | |
| 7,590,905 B2 * | 9/2009 | Abdel-Hafez et al. | 714/726 |
| 2003/0154433 A1 | 8/2003 | Wang et al. | |
| 2004/0190331 A1 * | 9/2004 | Ross et al. | 365/154 |

OTHER PUBLICATIONS

A. Dutta and N.A. Touba, "Using Limited Dependence Sequential Expansion for Decompressing Test Vectors", *Proc. of IEEE International Test Conference*, Paper 23.1, 2006 IEEE.
K.-J. Lee et al, "Broadcasting Test Patternsto Multiple Circuits", *IEEE Transactions on Computer-Aided Design of Integrated Circuits and Systems*, vol. 18, No. 12, pp. 1793-1802, Dec. 1999.
Pandey et al, "An incremental Algorithm for Test Generation in Illinois Scan Architecture Based Designs," Proc., IEEE 2002 Design. Automation and Test in Europe, pp. 368-375, 2002.
B. Koenemann, "LFSR-Coded Test Patterns for Scan Designs",*Proc., European Test Conf.*, pp. 237-242, 1991.

* cited by examiner

*Primary Examiner* — Robert Beausoliel
*Assistant Examiner* — Dipakkumar Gandhi
(74) *Attorney, Agent, or Firm* — Bacon & Thomas, PLLC

(57) ABSTRACT

A pipelined scan compression method and apparatus for reducing test data volume and test application time in a scan-based integrated circuit without reducing the speed of the scan chain operation in scan-test mode or self-test mode. The scan-based integrated circuit contains one or more scan chains, each scan chain comprising one or more scan cells coupled in series. The method and apparatus includes a decompressor comprising one or more shift registers, a combinational logic network, and an optional scan connector. The decompressor decompresses a compressed scan pattern on its compressed scan inputs and drives the generated decompressed scan pattern at the output of the decompressor to the scan data inputs of the scan-based integrated circuit. Any input constraints imposed by said combinational logic network are incorporated into an automatic test pattern generation (ATPG) program for generating the compressed scan pattern for one or more selected faults in one-step.

34 Claims, 15 Drawing Sheets

METHOD AND APPARATUS FOR PIPELINED SCAN COMPRESSION

RELATED APPLICATION DATA

The present application is a continuation-in-part of application Ser. No. 11/122,244 filed May 5, 2005 now U.S. Pat. No. 7,590,905 which is hereby incorporated by reference and for which priority is claimed, which application claims the benefit of U.S. Provisional Application No. 60/573,341 filed May 24, 2004.

The present application is also related to application Ser. No. 10/339,667 filed Jan. 10, 2003.

FIELD OF THE INVENTION

The present invention generally relates to the field of logic design and test using design-for-test (DFT) techniques. Specifically, the present invention relates to the field of logic test and diagnosis for integrated circuits using scan or built-in self-test (BIST) techniques.

BACKGROUND

Different scan compression techniques have emerged for compressing scan patterns, generated using automatic test pattern generation (ATPG) tools, for reducing both test application time and test data volume. Current scan compression techniques rely on inserting a decompressor between a limited number of compressed scan inputs and a large number of internal scan chains. The decompressor can be designed as a combinational circuit that generates decompressed scan patterns for the internal scan chains depending on the compressed scan patterns applied to the compressed scan inputs, or as a sequential circuit that can be used to generate the decompressed scan patterns for the internal scan chains based on previously stored states of the sequential elements.

Scan compression techniques utilizing a combinational decompressor typically consist of an exclusive-OR (XOR) or multiplexor (MUX) tree that may be controlled by additional control inputs or controlled by an internally stored state. See the patent co-authored by Koenemann et al. (2003) and the patent application co-authored by Wang et al. (2003). Scan compression techniques utilizing a sequential decompressor typically embed a linear-feedback shift register (LFSR) between the compressed scan inputs and internal scan chains and use the compressed scan inputs to control the LFSR in a way that makes it generate the required decompressed scan patterns, while utilizing 'don't care' states present in the decompressed scan patterns to reduce the complexity of the problem. See the paper co-authored by Koenemann et al. (1991) and the patent co-authored by Rajski et al. (2001).

In general, scan compression techniques utilizing a sequential decompressor such as an LFSR circuit is difficult to use, requiring additional software to solve the linear equations involved in order to translate the decompressed scan patterns into the external compressed scan patterns that can be used to generate the required decompressed scan patterns through the LFSR. This results in a two-step test generation process. In some cases, these linear equations can turn out to be unsolvable, requiring multiple iterative runs where the decompressed scan patterns are reordered, duplicated, or regenerated in order to be able to generate compressed scan patterns which covers all the required faults. This can result in a significant computational overhead. In general, the compression capability of these techniques is limited since it requires that the decompressed scan patterns be generated loosely in order to guarantee that the compression equations can be solved. This results in compressing decompressed scan patterns that are sub-optimal, as opposed to compressing tightly packed decompressed scan patterns where both static and dynamic compaction are performed aggressively. Finally, any changes made to the circuit after generating the decompressed scan patterns require abandoning these patterns and going back to the beginning of the iterative process. This makes these techniques much less attractive than techniques utilizing a combinational decompressor, built mainly out of XOR or MUX gates which can utilize a one-step test generation process to automatically generate patterns that are encodable.

Current techniques utilizing a combinational decompressor, such as circuits built out of XOR or MUX gates, utilize different combinational circuit designs for generating the decompressed scan patterns. In some techniques, the decompressed scan patterns are generated such that the decompressed scan patterns for each internal scan chain depends on multiple compressed scan inputs. In other techniques, the decompressed scan patterns for each internal scan chain depends on only one compressed scan input, with a few additional control inputs used to alter the relationship for different scan patterns. Finally, in some techniques, sequential elements are used in place of the additional control inputs to alter the relationship for different scan patterns. These sequential elements are typically preloaded with different data for each scan pattern. The advantage of these techniques is that the relationship between the decompressed scan patterns and the compressed scan patterns is easy to define and understand, and can be easily incorporated into the ATPG tools as part of the vector generation process, such that the compressed scan patterns are generated automatically, with dynamic compaction being aggressively applied.

The main difficulty with current decompression solutions utilizing a combinational decompressor is that the decompression is typically done in one stage, which is placed between the compressed scan inputs and the first scan cell of each internal scan chains. This introduces a long combinational path between the compressed scan inputs and the internal scan cells, which slows down the speed at which the scan chains can be operated.

For example, a design including 8 compressed scan inputs and 512 internal scan chains (1 to 64 ratio) requires 6 levels of XOR gates, XOR gates being among the slowest combinational logic library cells. An additional delay is further introduced due to the fact that the first scan cell is typically located at a distance from the compressed scan inputs. Finally, since the compressed scan inputs are typically shared in normal mode, this can result in overloading the input pins and reducing the amount of time these pins can be operated at, which can adversely affect the regular chip functionality. The same problems exist in combinational decompressors utilizing MUX gates as their basic building block.

A similar problem exists when the scan data responses captured in the internal scan chains are compressed into compressed scan data responses driven out on a smaller number of compressed scan outputs. For compression techniques utilizing a sequential compressor, difficulties arise due to the fact that all unknowns now have to be accounted for and tolerated in scan mode (during shift-in and shift-out operations), which can result in a significant gate overhead for scan designs utilizing these techniques. For designs utilizing a combinational compressor, a similar number of XOR gate levels may have to be placed between the last scan cell of the internal scan chains and the compressed scan outputs, creating similar delays and loading problems as the combinational decompressor used on the input side. The same problems also exist in combinational compressor designs utilizing MUX gates as their basic building block.

Accordingly, there is a need to develop an improved method and apparatus for scan compression. The method in this invention is based on pipelining the decompressor and compressor and placing (embedding) them in between the scan cells of the scan-based design.

SUMMARY OF THE INVENTION

Accordingly, in this invention, the difficulties that arise from using a combinational decompressor and compressor are solved by splitting the decompressor and compressor into intermediate decompressors and compressors and pipelining the intermediate decompressors and compressors by embedding them between the scan cells of the scan design somewhere at the beginning and at the end of the internal scan chains, respectively. This pipelining can be implemented using any number of intermediate decompressors and compressors depending on the speed that the scan chains are required to operate.

For example, for the design comprising 8 compressed scan inputs and 512 internal scan chains, the combinational decompressor can be inserted such that the 8 compressed scan inputs drive 8 intermediate scan chains each comprising one internal scan cell. These 8 scan cells in turn are used to drive another 16 intermediate scan chains each comprising one internal scan cell through one level of XOR gates that comprise the first intermediate decompressor. Next, these 16 scan cells are used to drive 32 internal scan cells through one-level of XOR gates that comprise the second intermediate decompressor, and this process is repeated until we reach the required 512 internal scan chains. Alternately, compressed scan input pin loading can be reduced by embedding the decompressor as one level of logic after an initial set of scan cells. A similar process is used to pipeline the combinational compressor at the end of the scan chains through multiple levels of scan cells and intermediate compressors, and a similar process is used to pipeline combinational decompressors and compressors which utilize MUX gates as their basic building block.

The main advantage of this invention is that since the decompressor and compressor is now pipelined, it is possible to perform scan compression where a maximum of one XOR or MUX gate is placed between any two scan cells, by dividing the long path between the compressed scan inputs and outputs and the internal scan chains over multiple levels of scan cells and intermediate decompressors and compressors. This allows us to perform compressed scan at a similar speed as regular scan. A further advantage is that it allows us to better balance scan chains, by performing the scan decompression and compression at different lengths for different scan chains. This allows us to control all scan chains to be the same length regardless of the number of scan cells controlled by each compressed scan input. Finally, scan cells that are needed to test faults that are hard to detect can be excluded from the scan compression process by placing them either before the pipelined decompressor, or after the pipelined compressor, which allows us to guarantee that the decompressor and compressor will not interfere with the testing of these faults.

Another advantage of this invention is that adding pipelined shift registers, which can comprise selected scan cells or spare flip-flops/latches in the combinational decompressor, provides greater encoding flexibility than purely combinational decompressors (XOR or MUX gates) while still retaining the ability to perform a one-step ATPG as described by Wang et al. (2003, Ser. No. 10/339,667) and Dutta and Touba (2006). Conventional LFSR-based decompressors contain feedback which results in very complex input constraints thereby requiring a two-step test generation process that requires a linear equation solver to check if test cubes (test patterns with unspecified don't care values, X's) are encodable to generate compressed scan patterns. By using shift registers, which do not contain feedback, the invention described here is able to have simple constraints making it feasible to directly account for them in the test generation program so that a one-step ATPG can be performed.

THE BRIEF DESCRIPTIONS OF DRAWINGS

The above and other objects, advantages and features of the invention will become more apparent when considered with the following specification and accompanying drawings wherein.

DETAILED DESCRIPTION OF THE INVENTION

The following description is presently contemplated as the best mode of carrying out the present invention. This description is not to be taken in a limiting sense but is made merely for the purpose of describing the principles of the invention. The scope of the invention should be determined by referring to the appended claims.

Figure 1:
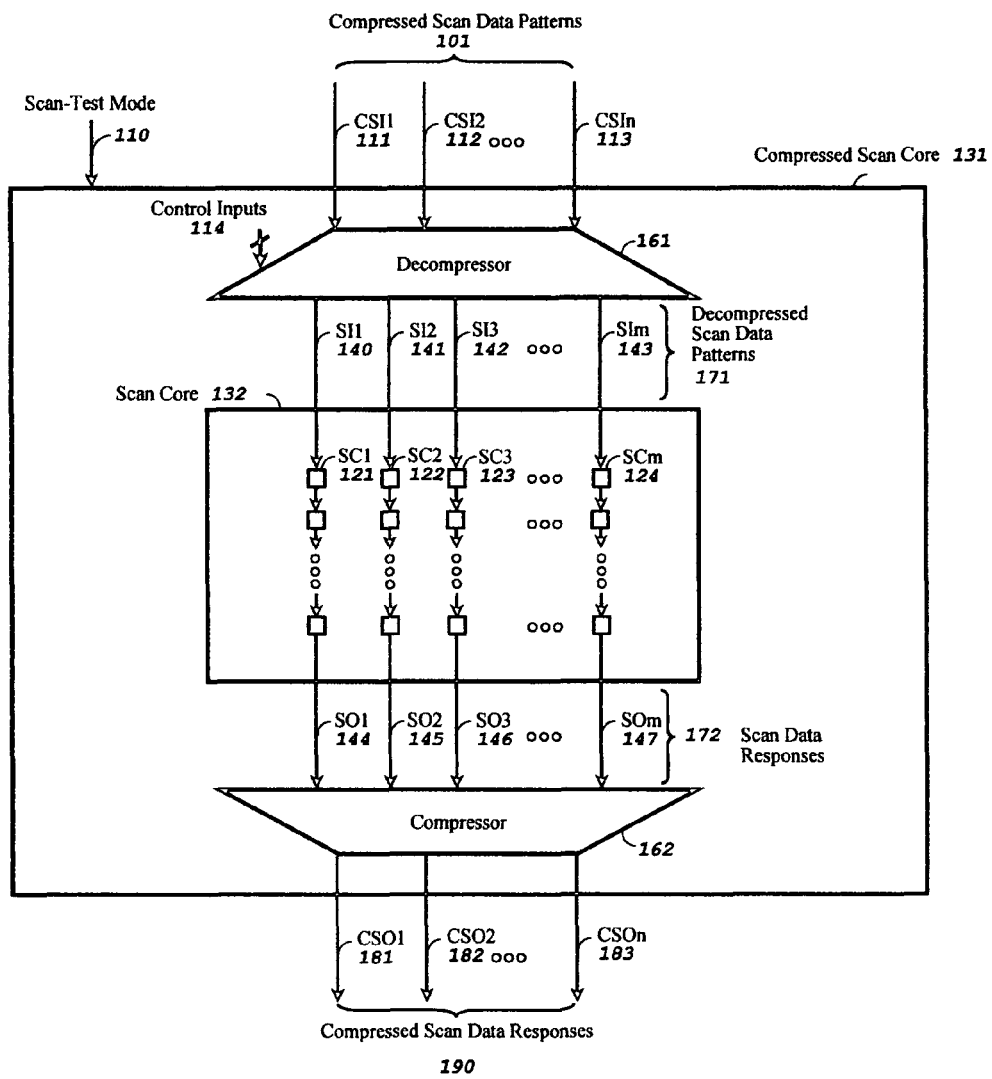
FIG. 1 shows a prior-art compressed scan test system for testing scan-based integrated circuits with compressed scan patterns using an ATE (automatic test equipment)

FIG. 1 shows a prior-art compressed scan test system for testing scan-based integrated circuits with compressed scan patterns using an ATE (automatic test equipment). The Compressed Scan Core 131 comprises a Scan Core 132 surrounded by a Decompressor 161 and Compressor 162. It further accepts a Scan-Test Mode 110 signal, and Compressed Scan patterns 101 applied on external compressed scan inputs CSI1 111 to CSIn 113 to drive the Decompressor 161. The Decompressor 161 also accepts Control Inputs 114 to control the Decompressor during scan-test. The Decompressor accepts the Compressed Scan patterns 101 and generates Decompressed Scan patterns 171 on the internal scan chain inputs SI1 140 to SIm 143 to drive the scan chains SC1 121 to SCm 124 embedded in Scan Core 132. Scan chain outputs SO1 144 to SOm 147 are then used to drive Compressor 162 to compact the Scan Data Responses 172 into Compressed Scan Data Responses 190 driven out of the Compressed Scan Core 131 on external compressed scan outputs CSO1 181 to CSOn 183. In this prior-art compressed scan test system, the ATE generates and applies the Compressed Scan patterns 101 to the Compressed Scan Core 131, and accepts the Compressed Scan Data Responses 190 for comparison.

Figure 2:
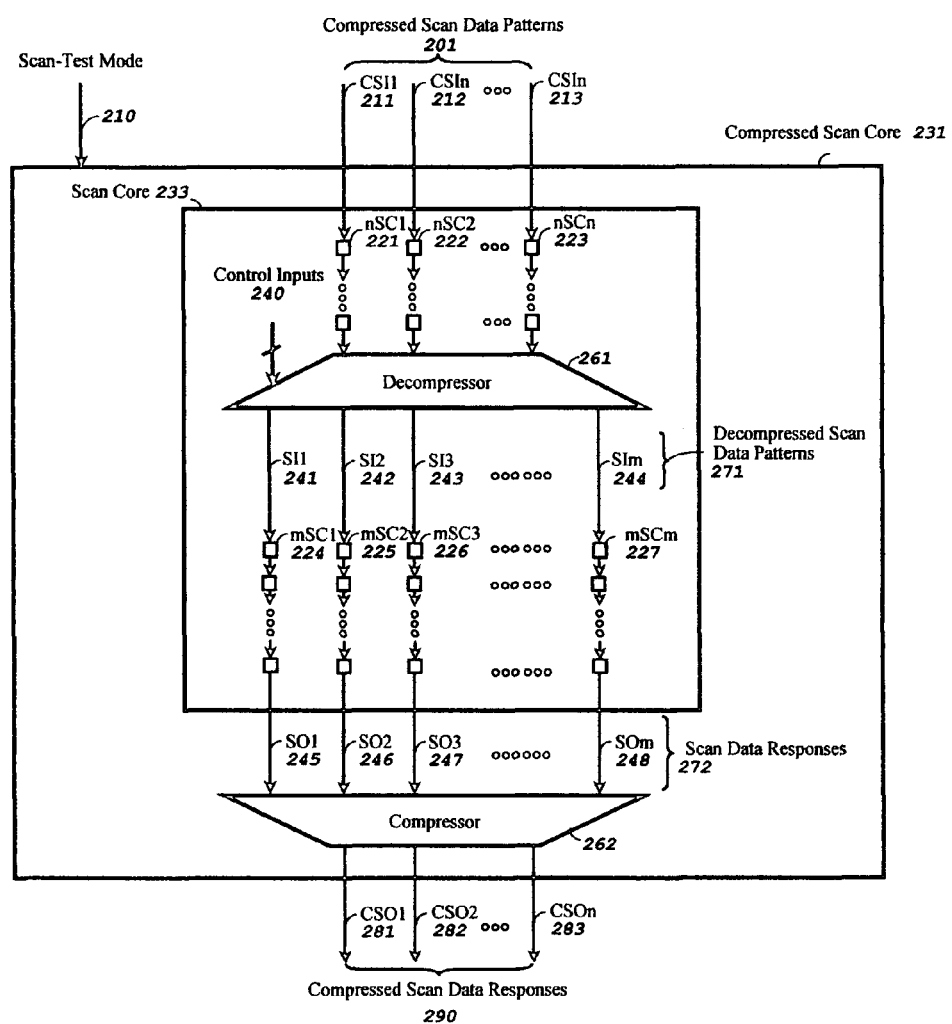
FIG. 2 shows a first embodiment of a pipelined compressed scan test system, in accordance with the present invention, for testing scan-based integrated circuits.

FIG. 2 shows a first embodiment of a pipelined compressed scan test system, in accordance with the present invention, for testing scan-based integrated circuits. The Compressed Scan Core 231 comprises a Scan Core 233 followed by a Compressor 262. Furthermore, the Scan Core 233 comprises N scan chains nSC1 221 to nSCn 223, M scan chains mSC1 224 to mSCm 227 with the Decompressor 261 embedded within the Scan Core 233, between the N scan chains and M scan chains. The Compressed Scan Core 231 further accepts a Scan-Test Mode 210 signal, and Compressed Scan patterns 201 applied on external compressed scan inputs CSI1 211 to CSIn 213 to drive the N scan chains nSC1 221 to nSCn 223. The N scan chains outputs are used to drive the Decompressor 261, which also accepts Control Inputs 240 to control the Decompressor during scan-test. The Decompressor 261 reads in the Compressed Scan patterns 201 after passing through the N scan chains and generates Decompressed Scan patterns 271 on the internal M scan chain inputs SI1 241 to SIm 244 to drive the M scan chains mSC1 224 to mSCm 227 embedded in the Scan Core 233.

The M scan chain outputs SO1 245 to SOm 248 are then used to drive Compressor 262 to compact the Scan Data Responses 272 into Compressed Scan Data Responses 290 driven out of the Compressed Scan Core 231 on external compressed scan outputs CSO1 281 to CSOn 283.

In this first embodiment of a pipelined compressed scan test system, the Compressed Scan patterns 201 are either generated externally on an ATE during scan-test, or generated internally using a PRPG (pseudorandom pattern generator) or RPG (random pattern generator) during self-test. Similarly, the Compressed Scan Data Responses 290 are either compared externally on an ATE during scan-test, or compacted internally using a MISR (multiple-input signature register) during self-test.

Figure 3:
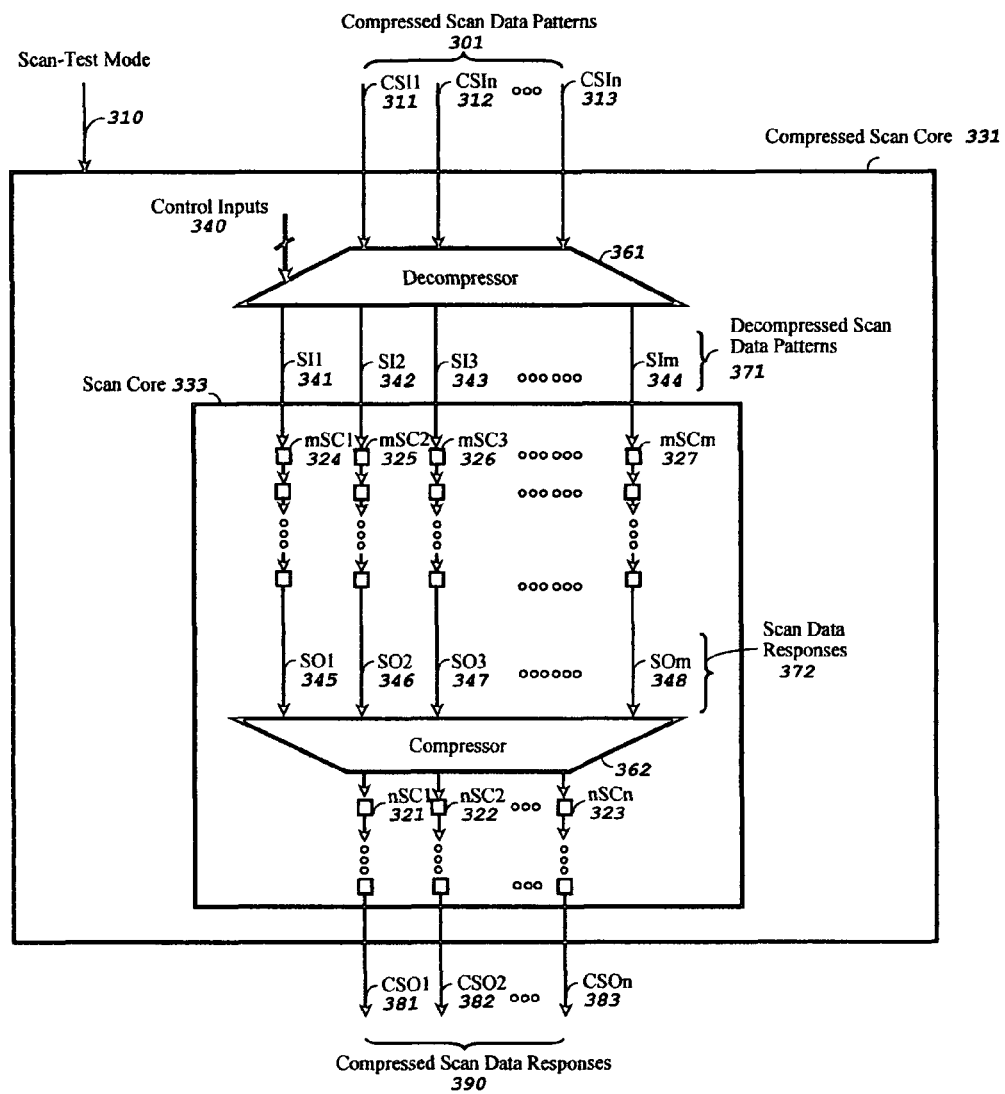
FIG. 3 shows a second embodiment of a pipelined compressed scan test system, in accordance with the present invention, for testing scan-based integrated circuits.

FIG. 3 shows a second embodiment of a pipelined compressed scan test system, in accordance with the present invention, for testing scan-based integrated circuits. The Compressed Scan Core 331 comprises a Decompressor 361 followed by a Scan Core 333. Furthermore, the Scan Core 333 comprises M scan chains mSC1 324 to mSCm 327, N scan chains nSC1 321 to nSCn 323 with the Compressor 362 embedded within the Scan Core 333, between the M scan chains and N scan chains. The Compressed Scan Core 331 further accepts a Scan-Test Mode 310 signal, and Compressed Scan patterns 301 applied on external compressed scan inputs CSI1 311 to CSIn 313 to drive the Decompressor 361. The Decompressor 361 also accepts Control Inputs 340 to control the Decompressor 361 during scan-test. The Decompressor 361 accepts the Compressed Scan patterns 301 and generates Decompressed Scan patterns 371 on the internal scan chain inputs SI1 341 to SIm 344 to drive the M scan chains mSC1 324 to mSCm 327 embedded in Scan Core 333.

The M scan chain outputs SO1 345 to SOm 348 are then used to drive Compressor 362 embedded in the Scan Core 333 to compact the Scan Data Responses 372 into Compressed Scan Data Responses 390, after passing through the N scan chains nSC1 321 to nSCn 323, which are driven out of the Compressed Scan Core 331 on external compressed scan outputs CSO1 381 to CSOn 383.

In this second embodiment of a pipelined compressed scan test system, the Compressed Scan patterns 301 are either generated externally on an ATE during scan-test, or generated internally using a PRPG or RPG during self-test. Similarly, the Compressed Scan Data Responses 390 are either compared externally on an ATE during scan-test, or compacted internally using a MISR during self-test.

Figure 4:
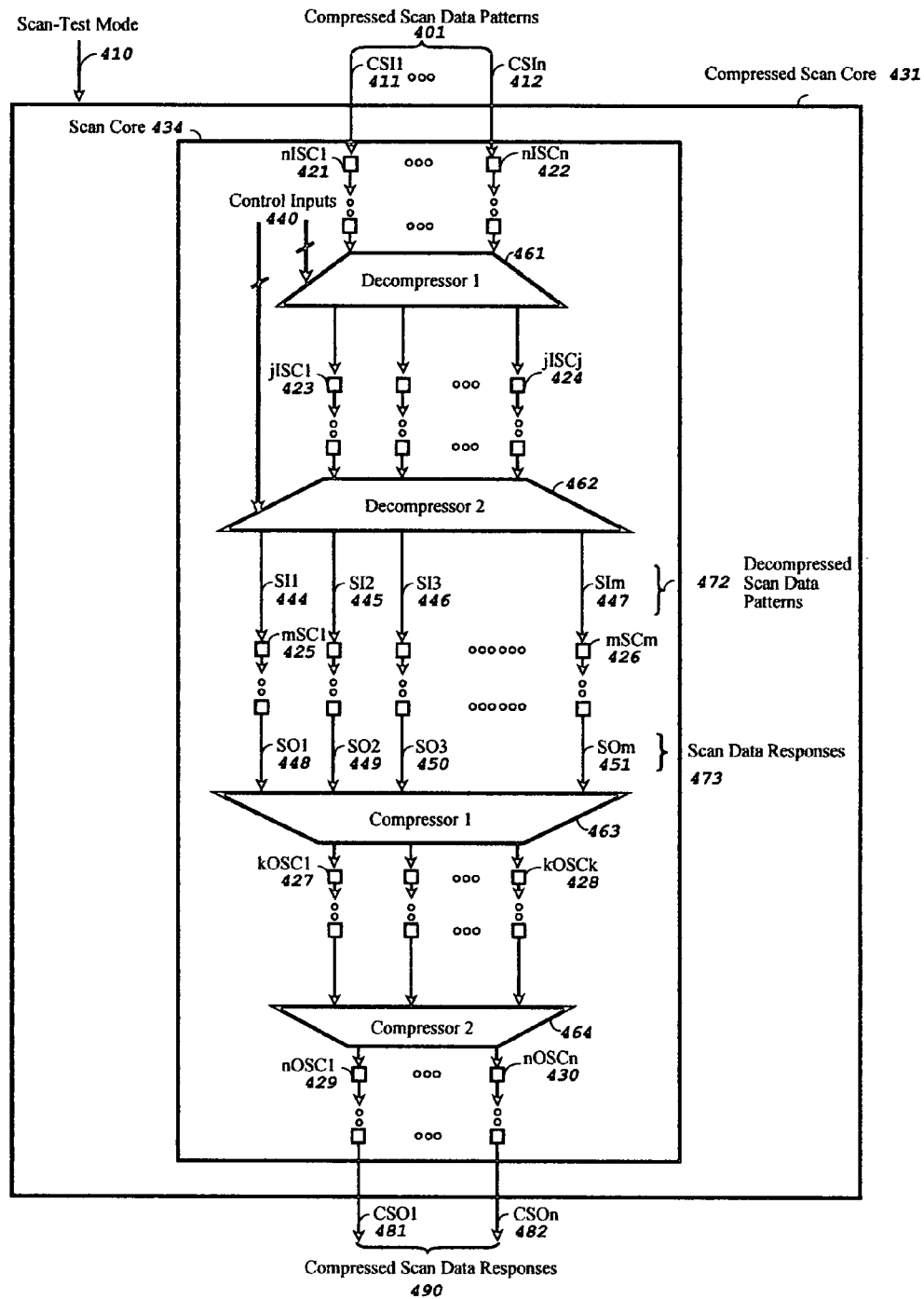
FIG. 4 shows a third embodiment of a pipelined compressed scan test system, in accordance with the present invention; for testing scan-based integrated circuits.

FIG. 4 shows a third embodiment of a pipelined compressed scan test system, in accordance with the present invention, for testing scan-based integrated circuits. The Compressed Scan Core 431 comprises a Scan Core 434 with two intermediate decompressors Decompressor1 461 and Decompressor2 462 and two intermediate compressors Compressor1 463 and Compressor2 464 embedded in the Scan Core 434. Furthermore, the Decompressor circuit is split and pipelined among the internal scan chains using the two intermediate decompressors, Decompressor1 461 and Decompressor2 462. Also, the Compressor circuit is split and pipelined among the internal scan chains using the two intermediate compressors, Compressor1 463 and Compressor2 464. The Scan Core 434 also comprises N input scan chains nISC1 421 to nISCn 422, J internal input scan chains jISC1 423 to jISCj 424 embedded between the intermediate stages of the pipelined Decompressor, M scan chains mSC1 425 to mSCm 426, K internal output scan chains kOSC1 427 to kOSCk 428 embedded between the intermediate stages of the pipelined Compressor, and N output scan chains nOSC1 429 to nOSCn 430.

The Compressed Scan Core 431 further accepts a Scan-Test Mode 410 signal, and Compressed Scan patterns 401 applied on external compressed scan inputs CSI1 411 to CSIn 412 to drive the N input scan chains nISC1 421 to nISCn 422. The N input scan chains outputs are used to drive the first intermediate decompressor Decompressor1 461, which also accepts Control Inputs 440 to control the Decompressor1 461 during scan-test. The Decompressor1 461 reads in the Compressed Scan patterns 401 after passing through the N input scan chains and its outputs are used to drive the second intermediate decompressor Decompressor2 462 after passing through the J internal input scan chains jISC1 423 to jISCj 424 to generate Decompressed Scan patterns 472 on the internal M scan chain inputs SI1 444 to SIm 447 to drive the M scan chains mSC1 425 to mSCm 426 embedded in Scan Core 434.

The M scan chain outputs SO1 448 to SOm 451 are then used to drive the first intermediate compressor Compressor1 463, and its outputs are used to drive the second intermediate compressor Compressor2 464 after passing through the K internal output scan chains kOSC1 427 to kOSCk 428 to compact the Scan Data Responses 473 into Compressed Scan Data Responses 490, which are driven out of the Compressed Scan Core 431 on external compressed scan outputs CSO1 481 to CSOn 482 after passing through the N output scan chains nOSC1 429 to nOSCn 430.

In this third embodiment of a pipelined compressed scan test system, the Compressed Scan patterns 401 are either generated externally on an ATE during scan-test, or generated internally using a PRPG or RPG during self-test. Similarly, the Compressed Scan Data Responses 490 are either compared externally on an ATE during scan-test, or compacted internally using a MISR during self-test.

Figure 5:
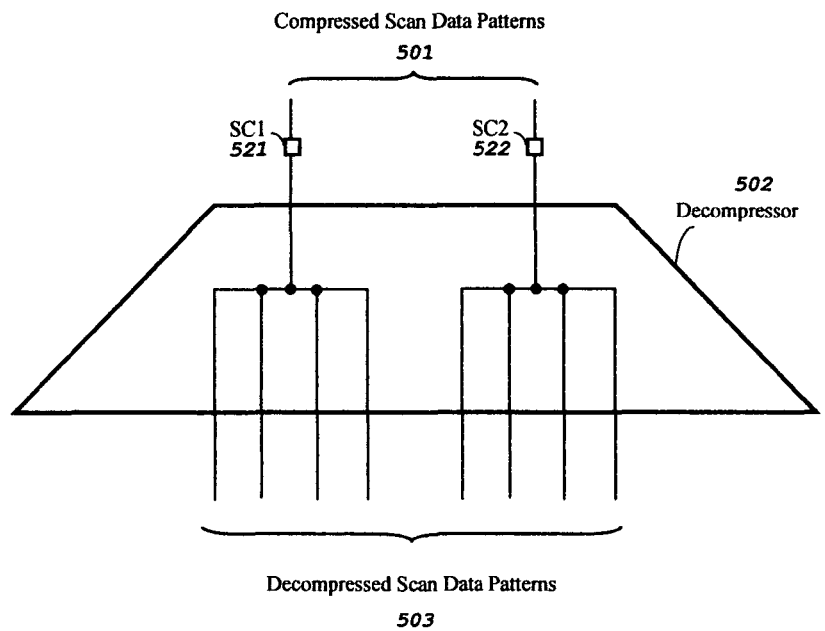
FIG. 5 shows a first embodiment of a pipelined decompressor, in accordance with the present invention.

FIG. 5 shows a first embodiment of a pipelined decompressor, in accordance with the present invention. The Decompressor 502 accepts Compressed Scan patterns 501 driven through scan cells SC1 521 and SC2 522, and compresses them over multiple outputs to generate Decompressed Scan patterns 503.

Figure 6:
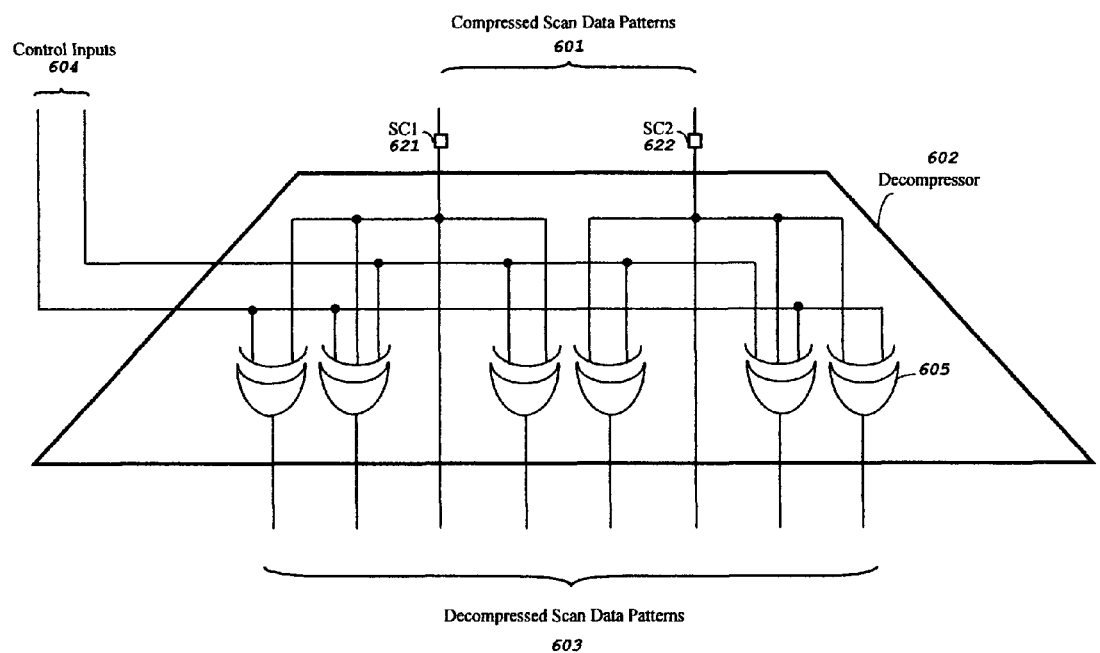
FIG. 6 shows a second embodiment of a pipelined decompressor, in accordance with the present invention.

FIG. 6 shows a second embodiment of a pipelined decompressor, in accordance with the present invention. The Decompressor 602 accepts Compressed Scan patterns 601 driven through scan cells SC1 621 and SC2 622, and Control Inputs 604 to generate Decompressed Scan patterns 603 by utilizing exclusive-OR (XOR) gates 605. The optional Control Inputs 604 are used to alter the relationship for different scan patterns, in order to improve fault coverage and fault diagnosis.

Figure 7:
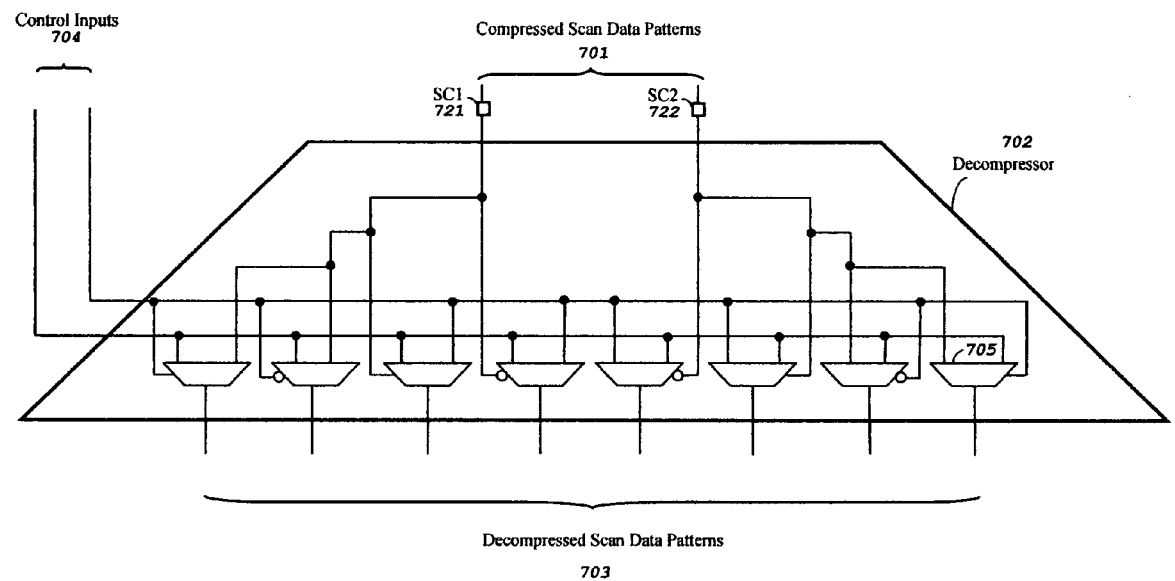
FIG. 7 shows a third embodiment of a pipelined decompressor, in accordance with the present invention.

FIG. 7 shows a third embodiment of a pipelined decompressor, in accordance with the present invention. The Decompressor 702 accepts Compressed Scan patterns 701 driven through scan cells SC1 721 and SC2 722, and Control Inputs 704 to generate Decompressed Scan patterns 703 by utilizing multiplexor (MUX) gates 705. The optional Control Inputs 704 are used to alter the relationship for different scan patterns, in order to improve fault coverage and fault diagnosis.

Figure 8:
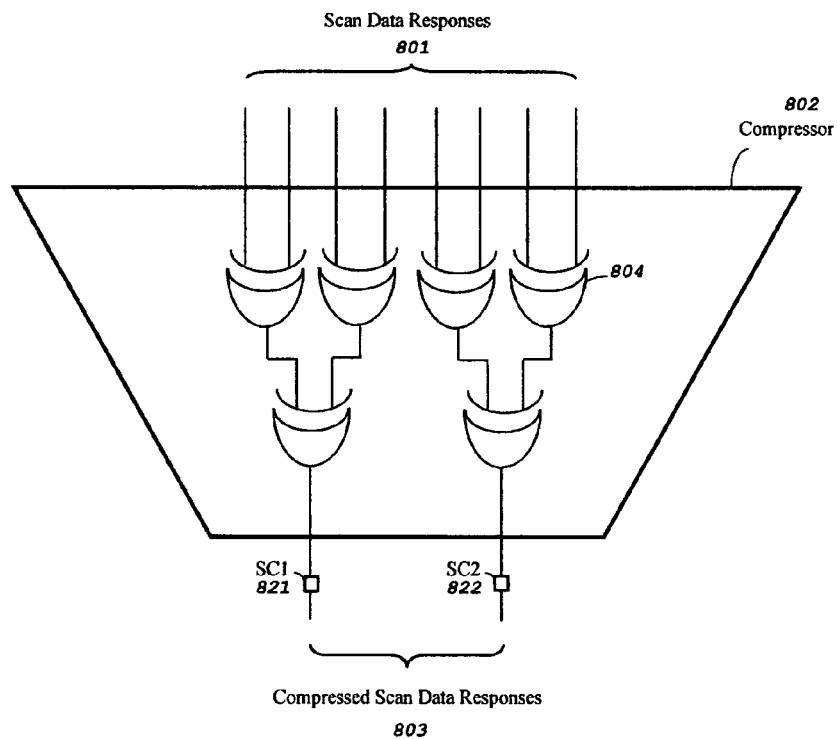
FIG. 8 shows a first embodiment of a pipelined compressor, in accordance with the present invention.

FIG. 8 shows a first embodiment of a pipelined compressor, in accordance with the present invention. The Compressor 802 accepts Scan Data Responses 801 to generate Compressed Scan Data Responses 803 after passing through scan cells SC1 821 and SC2 822, by utilizing exclusive-OR (XOR) gates 804. A compressor utilizing an X-tolerant XOR network, having at least one internal scan chain output connected to two or more XOR gates, is also included within the scope of this invention.

Figure 9:
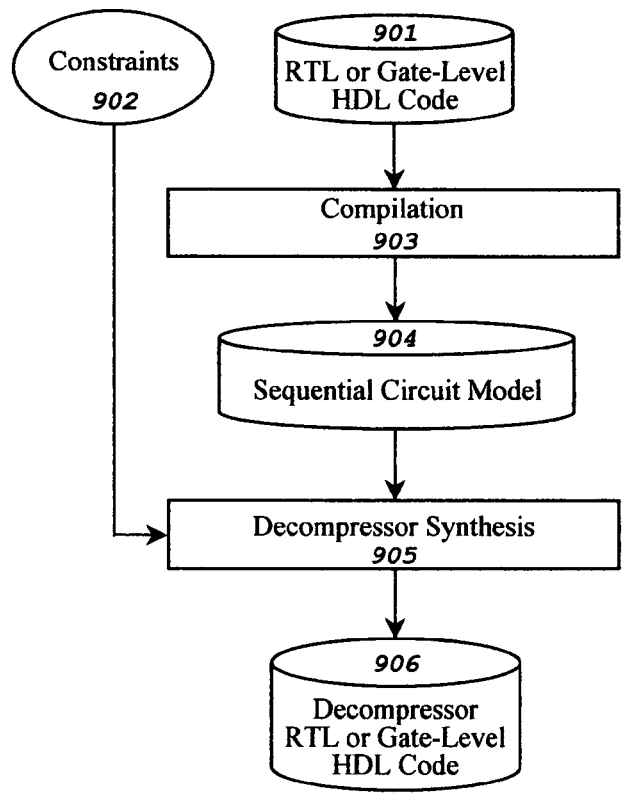
FIG. 9 shows a flow diagram of a method for synthesizing a decompressor in either RTL (register-transfer level) or gate-level, in accordance with the present invention.

FIG. 9 shows a flow diagram of a method for synthesizing a decompressor in either RTL (register-transfer level) or gate-level, in accordance with the present invention. In this flow diagram, RTL or Gate-Level HDL Code 901 goes through Compilation 903 to generate Sequential Circuit Model 904. Next, Decompressor Synthesis 905 is performed according to Sequential Circuit Model 904 and Constraints 902 to generate Decompressor RTL or Gate-Level HDL Code 906. The Decompressor RTL or Gate-Level HDL Code 906 is generated as a combinational logic network comprising any combination of logic gates, such as AND gates, OR gates, NAND gates, NOR gates, XOR gates, XNOR gates, multiplexers, buffers, and inverters.

Figure 10:
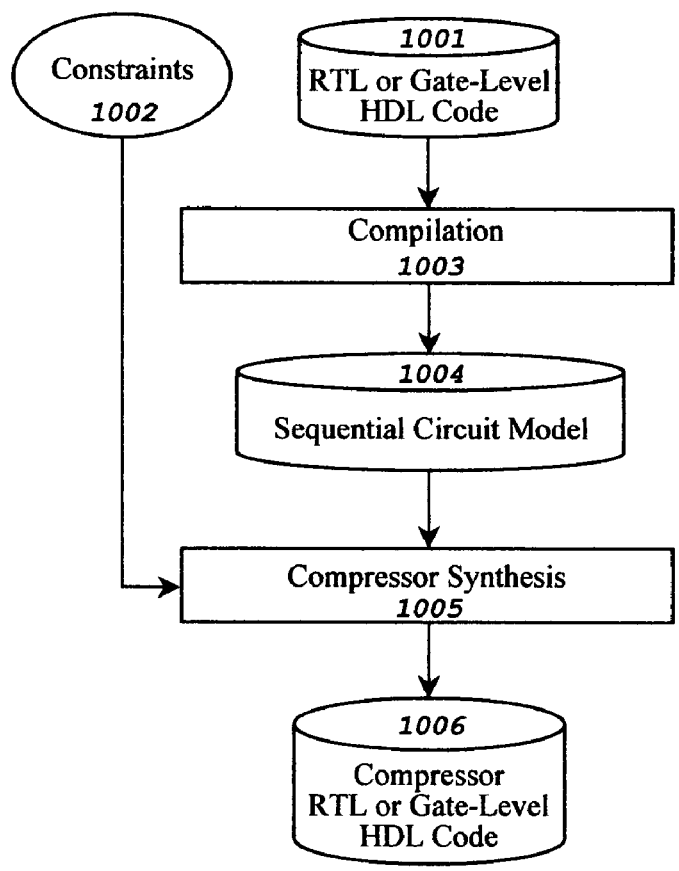
FIG. 10 shows a flow diagram of a method for synthesizing a compressor in either RTL (register-transfer level) or gate-level, in accordance with the present invention.

FIG. 10 shows a flow diagram of a method for synthesizing a compressor in either RTL (register-transfer level) or gate-level, in accordance with the present invention. In this flow diagram, RTL or Gate-Level HDL Code 1001 goes through Compilation 1003 to generate Sequential Circuit Model 1004. Next, Compressor Synthesis 1005 is performed according to Sequential Circuit Model 1004 and Constraints 1002 to generate Compressor RTL or Gate-Level HDL Code 1006. The Compressor RTL or Gate-Level HDL Code 1006 is generated as a combinational logic network comprising any combination of logic gates, such as AND gates, OR gates, NAND gates, NOR gates, XOR gates, XNOR gates, multiplexers, buffers, and inverters.

Figure 11:
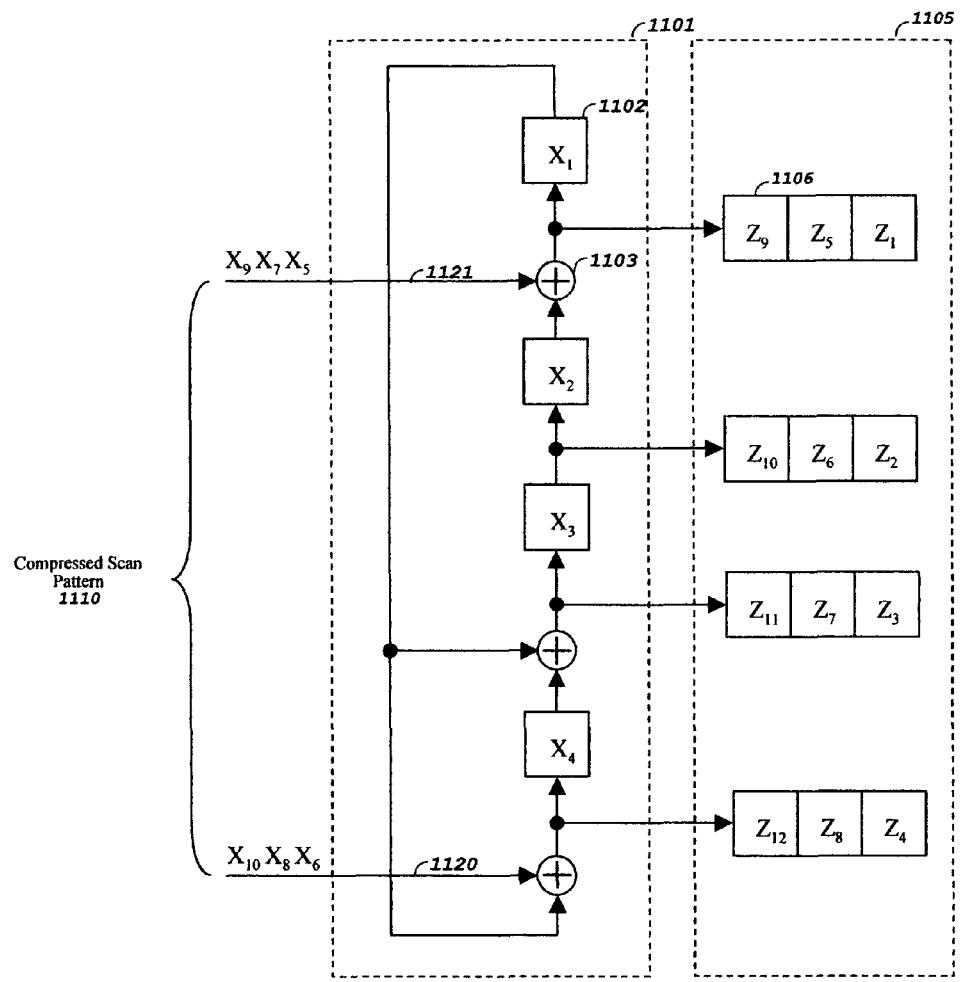
FIG. 11 shows a block diagram of a conventional decompressor using LFSR-based decompression.

FIG. 11 shows a block diagram of a conventional decompressor using LFSR-based decompression. The decompressor 1101 consists of a linear-feedback shift register (LFSR) which is comprised of flip-flops 1102 and XOR gates 1103. The decompressor 1101 receives a compressed scan pattern 1110 on its inputs 1120 and 1121, and generates a decompressed scan pattern on its outputs which are used to load the test into the scan data inputs of the scan core 1105. The flip-flops in the LFSR are configured in a circular loop such that the value stored in one flip-flop will propagate in a circular fashion and influence all future states of the LFSR.

Each initial value of a flip-flop in the LFSR, and each bit of the compressed scan pattern can be symbolically denoted by variables which take on binary values (0 or 1). These variables are labeled $X_1$ through $X_{10}$ in the diagram. The value $Z_1$ through $Z_{12}$ loaded into each scan cell 1106 in the scan core 1105 can be expressed as a modulo-2 sum of a subset of the variables $X_1$ through $X_{10}$. To determine whether a particular decompressed scan pattern can be generated by the decompressor 1101 requires solving a set of linear equations consisting of one equation for each specified bit of the test after a test cube is generated by an automatic test pattern generation (ATPG) program for selected faults as described by Wang et al. (2003, Ser. No. 10/339,667) and Dutta and Touba (2006). The solution to the linear equations gives a set of values for $X_1$ through $X_{10}$ that will generate each specified value of the test. Because solving the set of linear equations is performed each time after a test cube is generated by ATPG for selected faults, the ATPG is referred to as a two-step ATPG. The resulting test cube becomes the compressed scan pattern appeared on the outputs of the decompressor 1101 that connect to the scan data inputs of the scan core 1105.

Because of the circular feedback in the LFSR structure, all future states of the LFSR depend on the present state of the LFSR. Consequently, the linear equation for a scan cell loaded in clock cycle t will depend on a subset of all values shifted into the LFSR up to clock cycle t.

Figure 12:
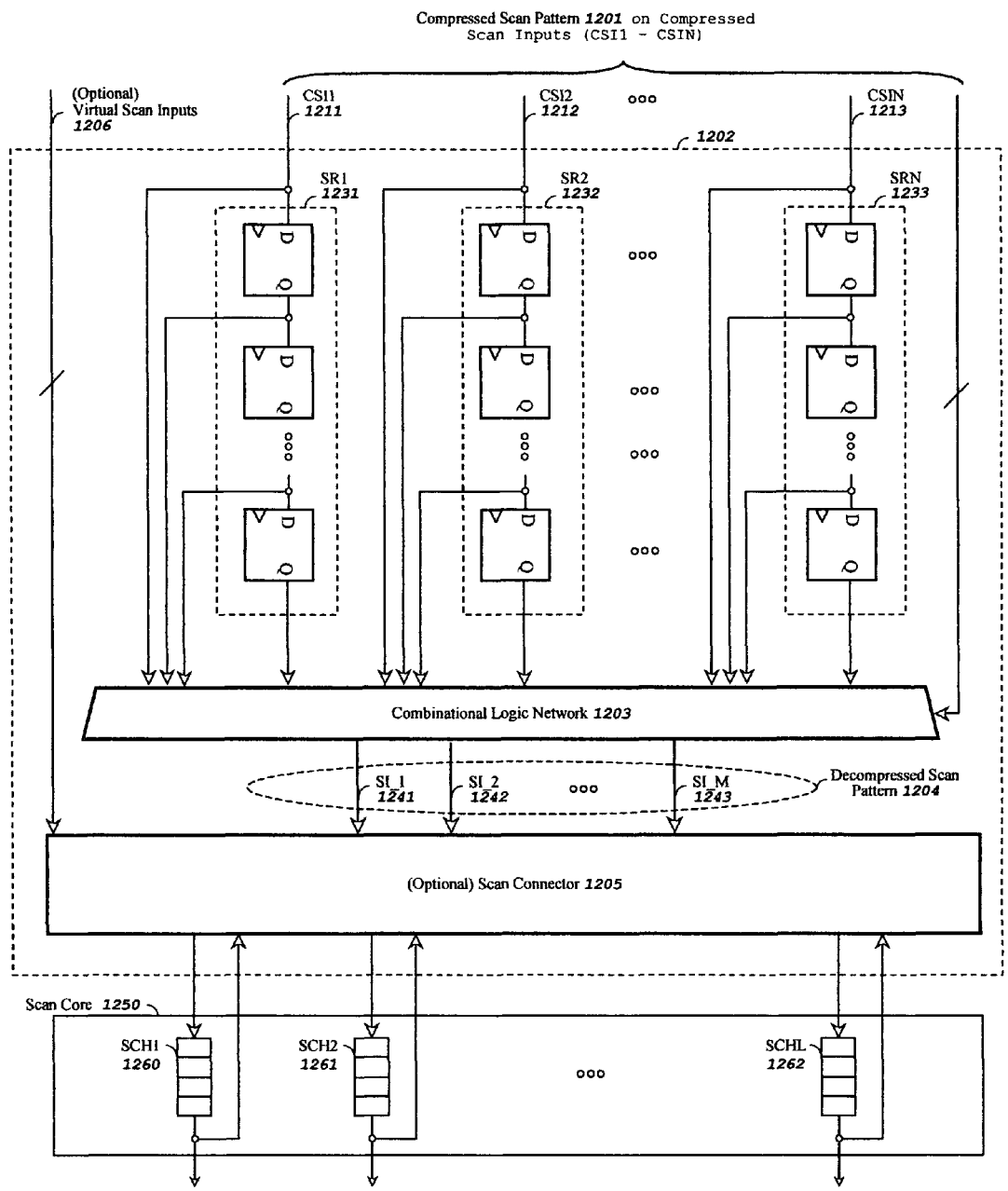
FIG. 12 shows a block diagram of a decompressor, in accordance with the present invention, consisting of multiple shift registers, a combinational logic network, and an optional scan connector.

FIG. 12 shows a block diagram of a decompressor, in accordance with the present invention, consisting of multiple shift registers, a combinational logic network, and an optional scan connector. The decompressor 1202 receives a compressed scan pattern 1201 on its compressed scan inputs, CSI1 1211 through CSIN 1213, and generates a decompressed scan pattern 1204 on its outputs, SI_1 1241 through SI_M 1243. The decompressed scan pattern 1204 is to be loaded into the scan data inputs of the scan core 1250 through the optional scan connector 1205. The scan core 1250 comprises one or more scan chains, SCH1 1260 through SCHL 1262, where each scan chain consists of multiple scan cells.

The multiple shift registers, SR1 1231 through SRN 1233, receive the compressed scan pattern 1201 from their compressed scan inputs CSI1 1211 through CSIN 1213. In principle, the multiple shift registers can comprise selected scan cells in the scan core 1250 or spare flip-flops or latches that are connected in series to form one or more pipelined shift registers and are placed between the compressed scan inputs and the combinational logic network. One unique property of the shift register is that there is no circular loop as in an LFSR shown in FIG. 11.

The combinational logic network 1203 receives its inputs from the compressed scan inputs, CSI1 1211 through CSIN 1213, and the flip-flops or latches in the shift registers, SR1 1231 through SRN 1233. The decompressor 1202 generates the decompressed scan pattern 1204 on its outputs, SI_1 1241 through SI_M 1243, which are used to load the test into the scan data inputs of the scan core 1250. The combinational logic network 1203 further comprises one or more combinational logic gates, selected from AND gates, OR gates, NAND gates, NOR gates, multiplexers, XOR gates, XNOR gates, buffers, inverters, or a combination of the above. The decompressed scan patterns are chosen to test manufacturing faults, including stuck-at faults, transition faults, path-delay faults, IDDQ (IDD quiescent current) faults, and bridging faults, in said scan-based integrated circuit.

The scan connector 1205 is optional. It is often used when it is required to (1) improve the fault coverage of the scan core 1250 and (2) allow easy silicon debug and diagnosis. Since the decompressor 1202 imposes input constraints on the scan core 1250, the fault coverage of the scan core 1250 with the decompressor is typically slightly lower than that without the decompressor. The scan connector can uncover the fault coverage loss. At least one virtual scan input 1206 is required for the reconfiguration of the scan chains, SCH1 1260 through SCHL 1262, to either split one long scan chain to two or more short scan chains or merge two or more short scan chains into one long scan chain. The scan connector 1205 typically comprises a multiplexer network that is controlled by one or more virtual scan inputs and is loaded with a predetermined state before a test session starts. In order to reduce or eliminate the inter-dependency of the scan chains, SCH1 1260 through SCHL 1262, during ATPG to increase the fault coverage of the scan core 1250, the scan connector may comprise additional multiplexers controlled by one or more said virtual scan inputs and spare scan cells in selected scan chains.

Because the shift registers differ from the LFSR 1101 in FIG. 11 in that they do not have a circular structure with feedback, the present state of the shift register can only influence a limited number of future states of the shift register. This property of the shift register greatly simplifies the constraints imposed by the decompressor. Unlike the conventional LFSR-based decompressor 1101 shown in FIG. 11, the constraints for each scan cell here depend only on a limited number of compressed scan pattern bits. This makes it feasible to incorporate the constraints into an ATPG program for generating the compressed scan pattern in one-step. It avoids the need for solving the set of linear equations in a two-step ATPG process.

The one-step ATPG incorporating the input constraints can be performed in one of three ways: (1) specifying the input-output relationship of the decompressor as a table of legal or illegal input combinations, (2) duplicating or expanding the decompressor into the database that represents the connectivity of the scan-based integrated circuit, or (3) simply using a sequential ATPG approach to incorporate said input constraints, for generating the compressed scan patterns.

Figure 13:
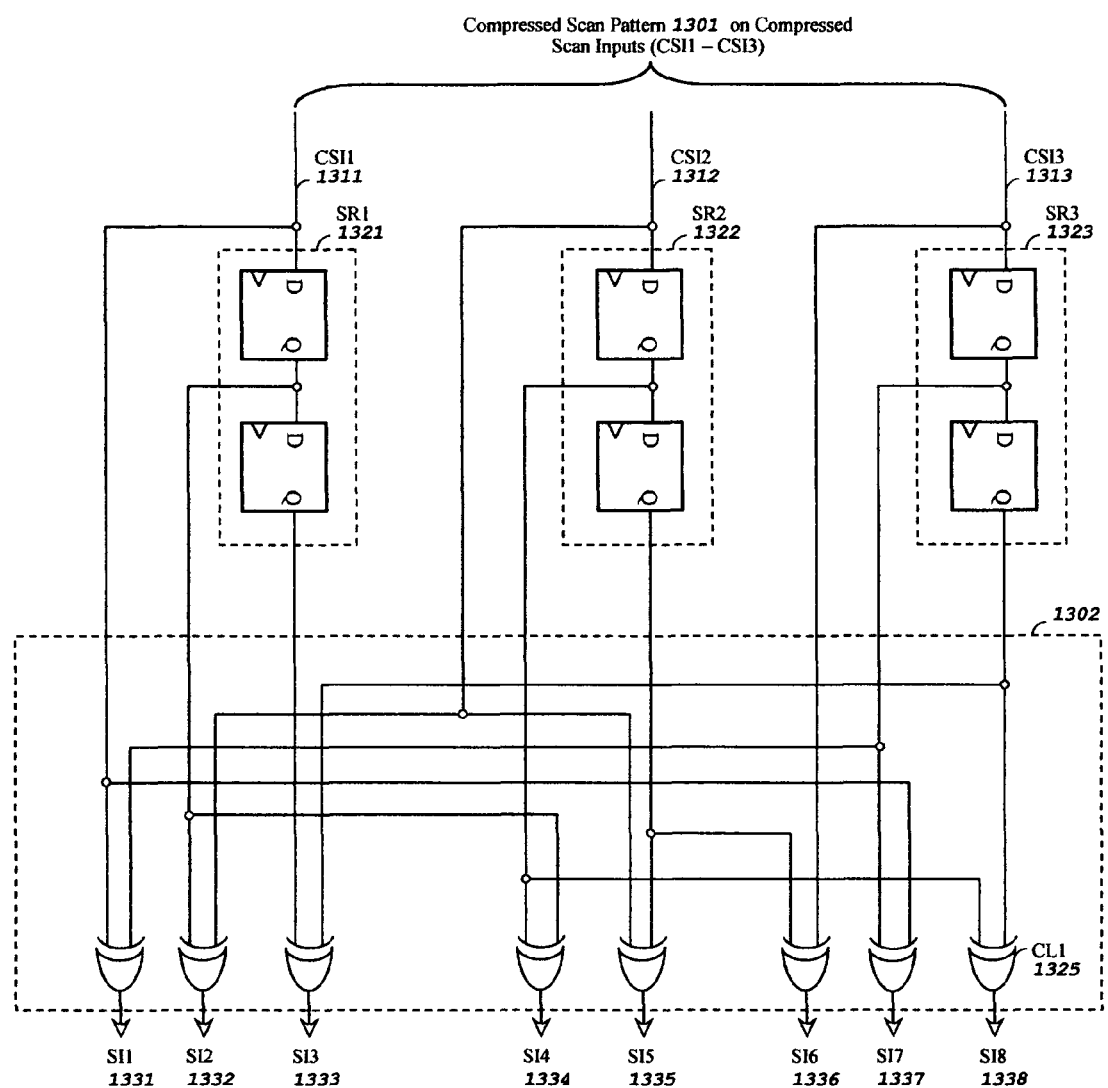
FIG. 13 shows a first embodiment of a decompressor shown in FIG. 12, in accordance with the present invention, consisting of multiple shift registers and a combinational logic network with multiple XOR gates.

FIG. 13 shows a first embodiment of a decompressor shown in FIG. 12, in accordance with the present invention, consisting of multiple shift registers and a combinational logic network with multiple XOR gates. The compressed scan inputs CSI1 1311, CSI2 1312, and CSI3 1313, to the shift registers SR1 1321, SR2 1322, and SR3 1323, are the compressed scan pattern 1301. The outputs of the flip-flops in the shift registers serve as inputs to the combinational logic block 1302. The combinational logic block 1302 consists of one XOR gate CL1 1325 per output which generates the module-2 sum of a subset of the combinational logic blocks inputs at the outputs of the combinational logic block (XOR network) 1302, SI1 1331 through SI8 1338.

The advantage of the decompressor in FIG. 13 compared with conventional decompressors constructed from only XOR gates is that the shift registers allow the decompressed scan patterns to depend not only on the inputs in the current clock cycle, but also on the inputs from 2 previous clock cycles. If a decompressed scan pattern requires that a large number of specified bits be generated at the output of the decompressor in a particular clock cycle, conventional combinational decompressors constructed from only XOR gates have very limited degrees of freedom to generate it because the data must be encoded using only the inputs in the current clock cycle as described by Dutta and Touba (2006). However, the decompressor in FIG. 13 has more degrees of freedom because the shift registers effectively expand the number of inputs available to the combinational logic block giving it access to a rolling window of three clock cycles worth of compressed scan data. This increases the encoding flexibility of the decompressor allowing it to achieve greater amounts of compression. This enhanced encoding flexibility is obtained while still retaining the ability to perform a one-step ATPG.

Figure 14:
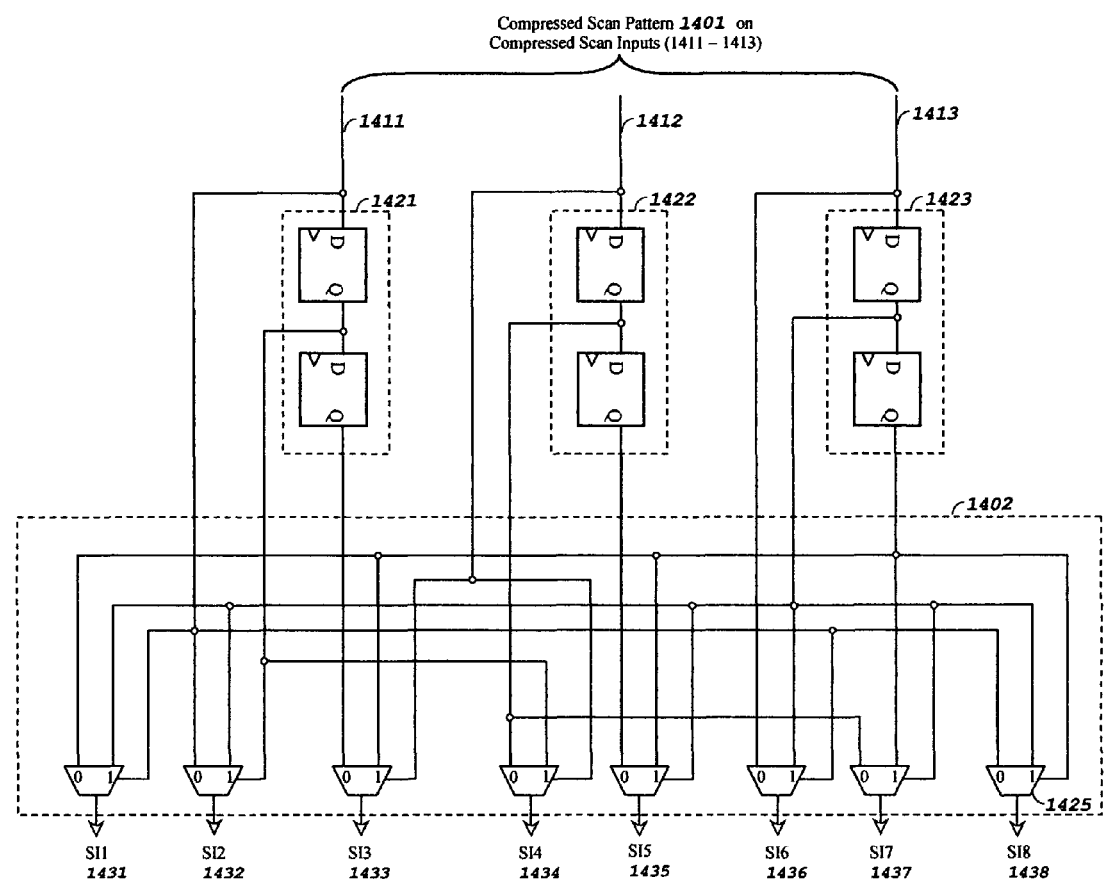
FIG. 14 shows a second embodiment of a decompressor shown in FIG. 12, in accordance with the present invention, consisting of multiple shift registers and a combinational logic network with multiple multiplexers (MUX gates)

FIG. 14 shows a second embodiment of a decompressor shown in FIG. 12, in accordance with the present invention, consisting of multiple shift registers and a combinational logic network with multiple multiplexers (MUX gates). The compressed scan inputs 1411, 1412, and 1413, to the shift registers 1421, 1422, and 1423, are the compressed scan pattern 1401. The outputs of the flip-flops in the shift registers serve as inputs to the combinational logic block 1402. The combinational logic block 1402 consists of one multiplexer 1425 per output which generates the module-2 sum of a subset of the combinational logic blocks inputs at the outputs of the combinational logic block (multiplexer network) 1402, SI1 1431 through SI8 1438.

The advantage of the decompressor in FIG. 14 compared with conventional decompressors constructed from only multiplexers is that the shift registers allow the decompressed scan patterns to depend not only on the inputs in the current clock cycle, but also on the inputs from 2 previous clock cycles. This is a similar advantage to what was described for the case of XOR gates in FIG. 13.

Figure 15:
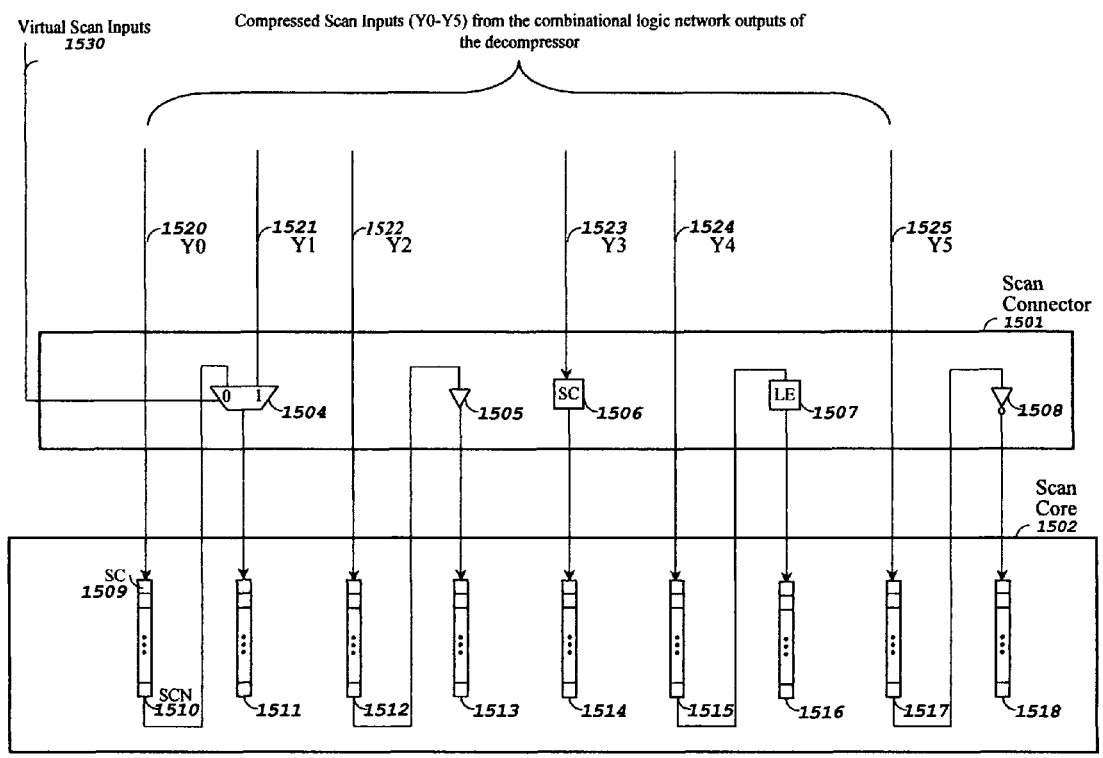
FIG. 15 shows an embodiment of a scan connector, in accordance with the present invention.

FIG. 15 shows an embodiment of a scan connector, in accordance with the present invention. The inputs to the scan connector, Y0 1520 through Y5 1525, come from the outputs of the combinational logic block 1203 shown in FIG. 12, and the outputs of the scan connector are used to drive the scan data inputs SC 1509 of the scan core 1502. The scan connector 1501 can contain any combination of multiplexers 1504, buffers 1505, spare scan cells SC 1506, lockup elements LE 1507, or inverters 1508. The multiplexers can be controlled by one of more virtual scan inputs 1530 and can be used to selectively merge two or more short scan chains into one long scan chain by connecting the last scan cell SCN of one scan chain of 1510 through 1518 to another scan chain, and vice versa. The buffers and inverters can be used to buffer long interconnects between scan chains. The spare scan cells can be used to reduce or eliminate inter-dependencies between scan chains. The lockup latches, which are typically storage elements such as flip-flops or latches, can be used to avoid clock skew problems at clock domain boundaries.

Having thus described presently preferred embodiments of the present invention, it can now be appreciated that the objectives of the invention have been fully achieved. And it will be understood by those skilled in the art that many changes in construction & circuitry, and widely differing embodiments & applications of the invention will suggest themselves without departing from the spirit and scope of the present invention. The disclosures and the description herein are intended to be illustrative and are not in any sense limitation of the invention, more preferably defined in scope by the following claims.

What is claimed is:

1. A decompressor having compressed scan inputs that accept compressed scan patterns for generating decompressed scan patterns to test a scan-based integrated circuit, the scan-based integrated circuit containing multiple scan chains, each scan chain comprising multiple scan cells coupled in series, said decompressor comprising:
   a) one or more shift registers directly connected to said compressed scan inputs, said one or more shift registers having shift register outputs; and
   b) a combinational logic network connected to said compressed scan inputs and said shift register outputs for connecting the outputs of said combinational logic network to selected scan inputs of all said scan chains.

2. The decompressor of claim 1, further including a first scan connector for selectively selecting said outputs of said combinational logic network or selected scan outputs of all said scan chains for connection to selected scan inputs of all said scan chains; wherein said first scan connector comprises a multiplexer network, and said multiplexer network is controlled by one or more virtual scan inputs and is loaded with a predetermined state before a test session starts.

3. The decompressor of claim 2, wherein said first scan connector further including using a plurality of second scan connectors to connect the outputs of said combinational logic network to selected scan chain inputs in said scan-based integrated circuit, wherein said plurality of second scan connectors include one or more buffers, inverters, lockup elements each comprising a storage element such as flip-flop or latch, spare scan cells, multiplexers, or any combination of the above.

4. The decompressor of claim 2, wherein said first scan connector further including a third scan connector for splitting a selected scan chain to two or more short scan chains or merge a plurality of selected scan chains into one long scan chain, wherein said third scan connector further comprises one or more multiplexers and wherein said multiplexers are controlled by one or more said virtual scan inputs.

5. The decompressor of claim 1, wherein said shift register selectively includes one or more flip-flops or latches; wherein said flip-flops or latches are selected scan cells in said scan-based integrated circuit, spare flip-flops or latches, or a combination of both, which are connected in series to form said shift registers.

6. The decompressor of claim 1, wherein said combinational logic network further includes one or more combinational logic gates, selected from AND gates, OR gates, NAND gates, NOR gates, multiplexers, XOR gates, XNOR gates, buffers, inverters, or a combination of the above.

7. The decompressor of claim 1, further including means for transmitting said compressed scan patterns to said compressed scan inputs and selected virtual scan inputs of said decompressor and transmitting said decompressed scan patterns generated by said decompressor to selected scan inputs of said scan chains in said scan-based integrated circuit.

8. The decompressor of claim 1, including an ATE (automatic test equipment) wherein said compressed scan patterns are stored in said ATE, transmitting said compressed scan patterns from said ATE to said decompressor and transmitting said decompressed scan patterns generated by said decompressor to said scan-based integrated circuit to test manufacturing faults, including stuck-at faults, transition faults, path-delay faults, IDDQ (IDD quiescent current) faults, and bridging faults, within said scan-based integrated circuit.

9. The decompressor of claim 1, wherein said decompressor is selectively located inside or external to said scan-based integrated circuit.

10. A method that accepts a compressed scan pattern stored in an ATE (automatic test equipment) for generating a decompressed scan pattern in a decompressor for testing a scan-based integrated circuit, said decompressor accepting the compressed scan pattern via compressed scan inputs for generating the decompressed scan pattern, the scan-based integrated circuit containing multiple scan chains, each scan chain comprising multiple scan cells coupled in series, the scan chains coupled to the decompressor, the decompressor comprising one or more shift registers directly connected to said compressed scan inputs and a combinational logic network connected to said compressed scan inputs and said shift register outputs for connecting the outputs of said combinational logic network to selected scan inputs of all said scan chains, said method comprising:
   a) placing said decompressor between said ATE and said scan-based integrated circuit;
   b) transmitting said compressed scan pattern stored in said ATE to said decompressor for generating said decompressed scan pattern to test manufacturing faults in said scan-based integrated circuit; and
   c) comparing a test response of said scan-based integrated circuit with an expected test response.

11. The method of claim 10, further including a first scan connector for connecting the outputs of said combinational logic network and selected scan outputs of all said scan chains to selected scan inputs of all said scan chains; wherein said first scan connector further comprises a multiplexer network controlled by one or more virtual scan inputs.

12. The method of claim 10, wherein said decompressor further includes using a plurality of second scan connectors to connect the outputs of said combinational logic network to selected scan chain inputs in said scan-based integrated circuit, wherein said plurality of second scan connectors include one or more buffers, inverters, lockup elements each comprising a storage element such as flip-flop or latch, spare scan cells, multiplexers, or any combination of the above.

13. The method of claim 10, wherein said shift register selectively comprises one or more flip-flops or latches; wherein said flip-flops or latches are selected scan cells in said scan-based integrated circuit, spare flip-flops or latches, or a combination of both, which are connected in series to form said shift registers.

14. The method of claim 10, wherein said combinational logic network further includes one or more combinational logic gates, selected from AND gates, OR gates, NAND gates, NOR gates, multiplexers, XOR gates, XNOR gates, buffers, inverters, or a combination of the above.

15. The method of claim 10, further including means for transmitting said compressed scan pattern to said compressed scan inputs and said virtual scan inputs of said decompressor and transmitting said decompressed scan pattern generated by said decompressor to selected scan inputs of said scan chains in said scan-based integrated circuit.

16. The method of claim 10, wherein said decompressor is selectively placed within said scan-based integrated circuit or inside said ATE.

17. The method of claim 10, wherein said decompressed scan patterns are chosen to test said manufacturing faults, including stuck-at faults, transition faults, path-delay faults, IDDQ (IDD quiescent current) faults, and bridging faults, in said scan-based integrated circuit.

18. A method that accepts a compressed scan pattern stored in an ATE (automatic test equipment) for generating a decompressed scan pattern in a decompressor to test a scan-based integrated circuit, said decompressor accepting the compressed scan pattern via compressed scan inputs for generating the decompressed scan pattern, the scan-based integrated circuit containing multiple scan chains, each scan chain comprising multiple scan cells coupled in series, the scan chains coupled to the decompressor, the decompressor comprising one or more shift registers directly connected to said compressed scan inputs and a combinational logic network connected to said compressed scan inputs and said shift register outputs for connecting the outputs of said combinational logic network to selected scan inputs of all said scan chains, said method comprising:
  a) using simulation, modeling said decompressor in said ATE;
  b) applying said compressed scan pattern stored in said ATE to generate said decompressed scan pattern using the simulated decompressor model;
  c) transmitting said decompressed scan pattern generated by said decompressor in said ATE to said scan chains in said scan-based integrated circuit for testing manufacturing faults in said scan-based integrated circuit; and
  d) comparing a test response of said scan-based integrated circuit with an expected test response.

19. The method of claim 18, further including a first scan connector for selectively selecting the outputs of said combinational logic network and selected scan outputs of all said scan chains for connection to selected scan inputs of all said scan chains; wherein said first scan connector further comprises a multiplexer network controlled by one or more virtual scan inputs.

20. The method of claim 18, wherein said decompressor further includes using a plurality of second scan connectors to connect the outputs of said combinational logic network to selected scan chain inputs in said scan-based integrated circuit, wherein said plurality of second scan connectors include one or more buffers, inverters, lockup elements each comprising a storage element such as flip-flop or latch, spare scan cells, multiplexers, or any combination of the above.

21. The method of claim 18, wherein said shift register selectively includes one or more flip-flops or latches; wherein said flip-flops or latches are selected scan cells in said scan-based integrated circuit, spare flip-flops or latches, or a combination of both, which are connected in series to form said shift registers.

22. The method of claim 18, wherein said combinational logic network further includes one or more combinational logic gates, selected from AND gates, OR gates, NAND gates, NOR gates, multiplexers, XOR gates, XNOR gates, buffers, inverters, or a combination of the above.

23. The method of claim 18, further including means for transmitting said compressed scan pattern to said compressed scan inputs and said virtual scan inputs of said decompressor, and means for transmitting said decompressed scan pattern generated by said decompressor to selected scan inputs of said scan chains in said scan-based integrated circuit.

24. The method of claim 18, wherein said decompressed scan patterns are chosen to test said manufacturing faults, including stuck-at faults, transition faults, path-delay faults, IDDQ (IDD quiescent current) faults, and bridging faults, in said scan-based integrated circuit.

25. A method for automatically generating a compressed scan pattern at the compressed scan inputs of a decompressor to test a scan-based integrated circuit connected to the decompressor, the scan-based integrated circuit containing multiple scan chains, each scan chain comprising multiple scan cells coupled in series, the scan chains coupled to the decompressor, the decompressor comprising one or more shift registers directly connected to said compressed scan inputs and a combinational logic network connected to said compressed scan inputs and said shift register outputs for connecting the outputs of said combinational logic network to selected scan inputs of all said scan chains, the compressed scan inputs receiving said compressed scan pattern from an automatic test equipment (ATE) and generating a decompressed scan pattern for driving the scan inputs of said multiple scan chains embedded in the scan-based integrated circuit, said method comprising:
  a) directly incorporating any input constraints imposed by said decompressor into an automatic test pattern generation (ATPG) program for generating said compressed scan pattern for one or more selected faults in one-step; and
  b) providing said compressed scan pattern to said decompressor for driving the scan inputs of said scan-based integrated circuit.

26. The method of claim 25, wherein said input constraints imposed by said decompressor into the ATPG program further comprises specifying the input-output relationship of the decompressor as a table of legal or illegal input combinations for generating said compressed scan pattern in one-step.

27. The method of claim 25, wherein said input constraints imposed by said decompressor into the ATPG program further comprises duplicating or expanding the decompressor into the database that represents the connectivity of the scan-based integrated circuit for generating said compressed scan pattern in one-step.

28. The method of claim 25, wherein said input constraints imposed by said decompressor into an ATPG program further comprises using a sequential ATPG approach to incorporate said input constraints for generating said compressed scan pattern in one-step.

29. The method of claim 25, wherein said shift register selectively includes one or more flip-flops or latches; wherein said flip-flops or latches are selected scan cells in said scan-based integrated circuit, spare flip-flops or latches, or a combination of both, which are connected in series to form said shift registers.

30. The method of claim 25, wherein said combinational logic network is selected from one or more logic gates, including AND gates, OR gates, NAND gates, NOR gates, multiplexers, XOR gates, XNOR gates, buffers, inverters, or any combination of the above.

31. The method of claim 25 wherein said decompressor further includes a first scan connector for selectively selecting the outputs of said combinational logic network or selected scan outputs of all said scan chains for connection to selected scan inputs of all said scan chains; wherein said first scan connector comprises a multiplexer network, and said multiplexer network is controlled by one or more virtual scan inputs and is loaded with a predetermined state before a test session starts.

32. The method of claim 31 wherein said first scan connector further includes using a plurality of second scan connectors to connect the outputs of said combinational logic network to selected scan chain inputs in said scan-based integrated circuit, wherein said plurality of second scan connectors include one or more buffers, inverters, lockup elements each comprising a storage element such as flip-flop or latch, spare scan cells, multiplexers, or any combination of the above.

33. The method of claim 25, further including means for transmitting said compressed scan pattern from said ATE to said compressed scan inputs of said decompressor and means for transmitting said decompressed scan pattern generated by said decompressor to selected scan data inputs of said scan chains in said scan-based integrated circuit.

34. The method of claim 25, wherein said compressed scan patterns are chosen to test said manufacturing faults, including stuck-at faults, transition faults, path-delay faults, IDDQ (IDD quiescent current) faults, and bridging faults, in said scan-based integrated circuit.

* * * * *